United States Patent [19]

Sato et al.

[11] Patent Number: 5,858,614
[45] Date of Patent: Jan. 12, 1999

[54] PHOTOSENSITIVE COMPOSITION FOR VOLUME HOLOGRAM RECORDING

[75] Inventors: Akihiko Sato, Suita; Masami Kawabata, Takatsuki; Iwao Sumiyoshi, Osaka, all of Japan

[73] Assignee: Nippon Paint Co., Ltd., Osaka, Japan

[21] Appl. No.: 728,031

[22] Filed: Oct. 9, 1996

Related U.S. Application Data

[63] Continuation of Ser. No. 226,583, Apr. 12, 1994, abandoned.

[30] Foreign Application Priority Data

Apr. 12, 1993 [JP] Japan ................... 5-084521

[51] Int. Cl.$^6$ ....................................... G03H 3/00
[52] U.S. Cl. ................... 430/280.1; 430/281.1; 430/1; 430/2; 522/4; 522/25; 359/3
[58] Field of Search ............. 522/4, 25; 430/1, 430/2, 270.1, 280.1, 281.1; 359/1, 3

[56] References Cited

U.S. PATENT DOCUMENTS

| | | | |
|---|---|---|---|
| 4,250,053 | 2/1981 | Smith .................... | 522/25 |
| 4,717,605 | 1/1988 | Urban et al. ............. | 522/25 |
| 4,842,980 | 6/1989 | Gottschalk et al. ....... | 430/281 |
| 4,849,320 | 7/1989 | Irving ................... | 430/281 |
| 4,859,572 | 8/1989 | Farid et al. ............. | 430/281 |
| 4,970,129 | 11/1990 | Ingwall et al. .......... | 430/1 |

FOREIGN PATENT DOCUMENTS

| | | | |
|---|---|---|---|
| 0335629 | 10/1989 | European Pat. Off. ...... | 522/4 |
| 0487086 | 5/1992 | European Pat. Off. ...... | 430/2 |
| 0509512 | 10/1992 | European Pat. Off. ...... | 430/2 |
| A0509512 | 10/1992 | European Pat. Off. . | |
| 1-244680 | 5/1991 | Japan . | |
| 3-259176 | 11/1991 | Japan ................... | 430/2 |
| 4-181944 | 6/1992 | Japan ................... | 430/281 |
| 4-325508 | 11/1992 | Japan . | |
| 5-32807 | 2/1993 | Japan . | |
| 5-070528 | 3/1993 | Japan . | |
| A05070528 | 3/1993 | Japan . | |
| 5-94014 | 4/1993 | Japan ................... | 430/2 |
| 93-01526 | 1/1993 | WIPO ................... | 430/2 |

OTHER PUBLICATIONS

Webster's New International Dictionary of the English Language, Second Ed. (© 1959) p. 81.

*Primary Examiner*—Martin Angebranndt
*Attorney, Agent, or Firm*—Townsend & Banta

[57] ABSTRACT

A photosensitive composition for volume hologram recording used for recording an interference fringe produced by the interference of laser beams or lights having excellent coherence as a fringe having a different refractive index, the composition comprising:

(a) a radical polymerizable compound having a 9,9-diarylfluorene skeleton, which is liquid at a normal temperature;

(b) a compound having compatibility with the component (a), which is selected from the group consisting of a cationic polymerizable compound, a radical polymerizable compound having no 9,9-diarylfluorene skeleton and a plasticizer; and (c) a radical photopolymerization initiator which is sensitive to laser beam having a specific wavelength or light having a specific wavelength and excellent coherence to polymerize the component (a);

wherein an average refractive index of the component (a) is larger than that of the component (b).

8 Claims, 1 Drawing Sheet

PHOTOSENSITIVE COMPOSITION FOR VOLUME HOLOGRAM RECORDING

CROSS REFERENCE TO A RELATED APPLICATION

This is a file wrapper continuation application of copending application Ser. No. 08/226,583, filed Apr. 12, 1994, now abandoned.

FIELD OF THE INVENTION

The present invention relates to a photosensitive composition for volume hologram recording, and a process for producing a volume hologram using the same. More particularly, it relates to a photosensitive composition for volume hologram recording affording a hologram having excellent diffraction efficiency, wavelength selectivity, refractive index modulation and transparency, and a process for producing a volume hologram by which a hologram can be produced easily using the same.

BACKGROUND OF THE INVENTION

A hologram is obtained by recording a wave front of object light as an interference fringe which is formed by interfering two kinds of lights having the same wavelength (object light and reference light) on a photosensitive material. When light having the same condition as that of the original reference light is irradiated to the hologram, a diffraction phenomenon due to the interference fringe occurs, and the same wave front as that of the original object light can be reproduced.

The hologram can be classified according to a recording form of the interference fringe.

Recently, the so-called hologram for recording the interference fringe according to a difference in refractive index in the interior of a recording layer has been applying for use such as in three-dimensional display, optical element and the like because of it's high diffraction efficiency and excellent wavelength selectivity.

As a photosensitive material for recording such a volume hologram, those compositions comprising silver halide or gelatin dichromate which have hitherto been used in the fields of art are popular. However, these compositions are not suitable for manufacturing the hologram industrially because wet development and complicated developing/fixing treatment are required. Further, there is a problem that the resulting image after recording disappears due to moisture absorption.

In order to overcome the above problem of conventional technique, U.S. Pat. Nos. 3,658,526 and 3,993,485 suggest preparing a volume hologram only by a simple dry treatment using a photopolymer. The hologram due to the photopolymer is estimated to proceed by a formation mechanism studied in "APPLIED OPTICS", B. L. Booth, Vol. 14, No. 3, PP 593–601 (1975); and W. J. Tomlinson, E. A. Chandross et al., Vol. 15, No. 2, PP 534–541 (1976). However, these techniques could not hardly compete with the above-described technique in view of refractive index modulation which is particularly important performance.

Improved techniques thereof are proposed in, for example, U.S. Pat. Nos. 4,942,102 and 4,942,112, Japanese Laid-Open Patent Publication No. 3-249685 and Japanese Patent Application No. 4-67021. In these techniques, a high refractive index radical polymerizable compound is used in combination with a non-reactive plasticizer, a radical polymerizable compound or a cationic polymerizable compound in order to improve refractive index modulation capability. In that case, a compound containing an atom (e.g. chlorine, bromine, sulfur, etc.) which contributes to high refractive index is used as the high refractive index radical polymerizable compound. In this case, compatibility of the high refractive index radical polymerizable compound with the non-reactive plasticizer or the cationic polymerizable compound is sometimes poor, and there is a problem such as insufficient dissolution of the composition, haze of the photosensitive material and the like. Further, when a compound free of an atom such as chlorine, bromine, sulfur, etc. which contributes to high refractive index is used for the high refractive index radical polymerizable compound, sufficient refractive modulation can not be obtained.

On the other hand, Japanese Laid-Open Patent Publication No. 5-32807 discloses an epoxy acrylate compound having a 9,9-diarylfluorene skeleton as the high refractive index radical polymerizable monomer containing no atom as described above. However, since epoxy acrylate compounds are solid at ambient temperature, the photosensitive material is hazy and, therefore, sufficient light transmission property cannot be obtained.

SUMMARY OF THE INVENTION

One object of the present invention is to provide a photosensitive composition for volume hologram recording providing a hologram having excellent diffraction efficiency, wavelength selectivity, refractive index modulation and transparency.

Another object of the present invention is to provide a process for producing a volume hologram by which a hologram can be produced easily using said photosensitive composition.

These objects as well as other objects and advantages of the present invention will become apparent to those skilled in the art from the following description with reference to the accompanying drawings.

Figure 1:
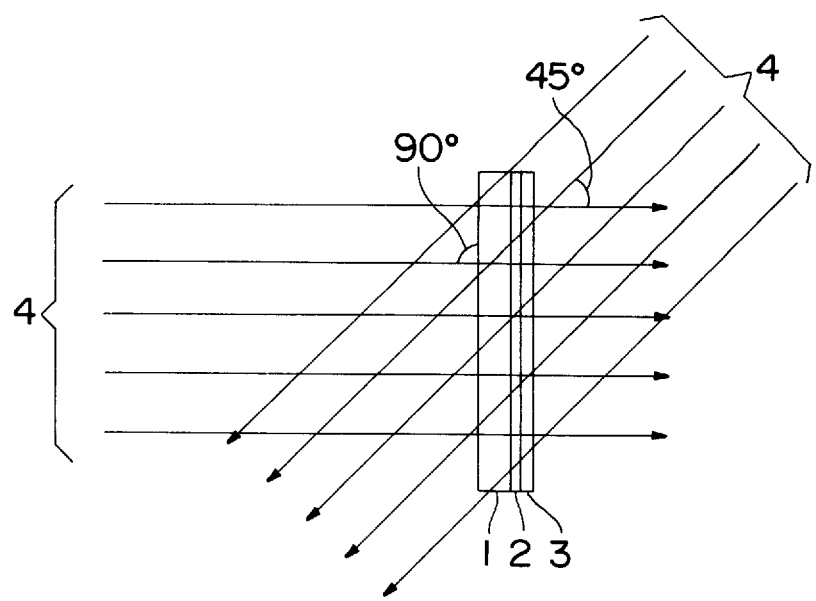
FIG. 1 is a schematic diagram illustrating a recording method of a reflection type hologram in the first exposure.

The present invention provides a photosensitive composition for volume hologram recording used for recording an interference fringe produced by the interference of laser beams or lights having excellent coherence as a fringe having a different refractive index, said composition comprising:

(a) a radical polymerizable compound having a 9,9-diarylfluorene skeleton, which is liquid at ambient temperature;

(b) a compound having compatibility with the component (a), which is selected from the group consisting of a cationic polymerizable compound, a radical polymerizable compound having no 9,9-diarylfluorene skeleton and a plasticizer; and (c) a radical photopolymerization initiator which is sensitive to laser beam having a specific wavelength or light having a specific wavelength and excellent coherence to polymerize the component (a);

wherein an average refractive index of the component (a) is larger than that of the component (b). As the component (b), a cationic polymerizable compound can be used. In this case, the composition further comprises a cationic photopolymerization initiator (d) having low photosensitivity to the above-described light having a specific wavelength, which is sensitive to light having a different wavelength to polymerize the component (b).

The present invention also provides a process for producing a volume hologram, which comprises irradiating with laser beam or light having excellent coherence, to which a radical photopolymerization initiator (c) is sensitized, the photosensitive composition for volume hologram recording applied on a substrate; and irradiating with light having a wavelength different from that of the above-described laser beam or light having excellent coherence, to which a cationic photopolymerization initiator (d) is sensitized.

DETAILED DESCRIPTION OF THE INVENTION

As the radical polymerizable compound (a) having a 9,9-diarylfluorene skeleton which is liquid at ambient temperature in the present invention, those having at least one ethylenically unsaturated double bond in a molecule are used. Further, an average refractive index of the radical polymerizable compound (a) is larger than that of the component (b), preferably 0.02 or more larger than that. When the average refractive index of the radical polymerizable compound (a) is smaller than that of the component (b), refractive index modulation becomes insufficient. The radical polymerizable compound (a) having a 9,9-diarylfluorene skeleton which is liquid at ambient temperature is represented by the formula:

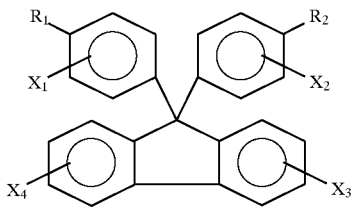

wherein $R_1$ and $R_2$ contain a radical polymerizable group such as an acryloyl group or a methacryloyl group at least one terminal, and this group and benzene ring are bonded through at least one oxyethylene chain, oxypropylene chain, urethane bond, amide bond and the like; and $X_1$ to $X_4$ respectively indicate H, ($C_1$–$C_4$) alkyl group, ($C_1$–$C_4$) alkoxy group, amino group, dialkylamino group, hydroxyl group, carboxyl group, halogen atom and the like.

Among them, are those in which the acryloyl or methacryloyl group and benzene ring are bonded through the oxyethylene or oxypropylene chain in $R_1$ and $R_2$ are particularly preferred. Examples thereof include 9,9-bis(4-acryloxydiethoxyphenyl)fluorene, 9,9-bis(4-acryloxytriethoxyphenyl)fluorene, 9,9-bis(4-acryloxytetraethoxyphenyl)fluorene, 9,9-bis(4-acryloxydipropoxyphenyl)fluorene, 9,9-bis(4-acryloxyethoxy-3,5-methylphenyl)fluorene, 9,9-bis(4-acryloxyethoxy-3-ethylphenyl)fluorene, 9,9-bis(4-acryloxydiethoxy-3-ethylphenyl)fluorene, 9,9-bis(4-acryloxyethoxy-3,5 -dimethyl)fluorene and compounds wherein "acryloxy" of the above compounds is replaced by "methacryloxy".

The radical polymerizable compound (a) having a 9,9-diarylfluorene skeleton is not limited by these compounds, and one or more sorts of them can be used in combination.

As the component (b) in the present invention, those having an average refractive index smaller than that of the component (a) as described above, which are compatible with the component (a), are used. Particularly, those which are liquid at an ambient temperature are preferred. By using those which are liquid at a normal temperature as the component (b), the radical photopolymerization of the component (a) can be conducted in a composition having relatively low viscosity from beginning to end. Thereby, the diffusion and transfer of the component (a) is enhanced to obtain large refractive index modulation. Further, as the component (b), a cationic polymerizable compound is used preferably. When the cationic polymerizable compound is used, the cationic photopolymerization initiator (d) is decomposed by irradiating light having a wavelength different from that of laser beam or light having excellent coherence to polymerize the cationic polymerizable compound. Therefore, a hologram having an excellent film strength can be prepared. The cationic polymerizable compound used in the present invention is cationically polymerized by Brönsted acid or Lewis acid generated by decomposition of the cationic photopolymerization initiator (d) in the composition according to the overall exposure (hereinafter referred to as a postexposure) after the component (a) is polymerized by irradiation of laser beam or light having excellent coherence (hereinafter referred to as a first exposure). Examples of the cationic polymerizable compound include those which are disclosed in Chemtech. Oct.; J. V. Crivello, page 624 (1980); Japanese Laid-Open Patent Publication No. 62-149784; Japanese Adhesive Society, Vol. 26, No. 5, PP 179–187 (1990) and the like.

Examples of the cationic polymerizable compound include diglycerol polyglycidyl ether, pentaerythritol polyglycidyl ether, 1,4-bis(2,3-epoxypropoxyperfluoroisopropyl) cyclohexane, sorbitol polyglycidyl ether, trimethylolpropane polyglycidyl ether, resorcin diglycidyl ether, 1,6-hexanediol diglycidyl ether, polyethylene glycol diglycidyl ether, phenyl glycidyl ether, paratertiary butylphenyl glycidyl ether, diglycidyl adipate, diglycidyl orthophthalate, dibromophenyl glycidyl ether, dibromoneopentyl glycol glycidyl ether, 1,2,7,8-diepoxyoctane, 1,6-dimethylolperfluorohexane diglycidyl ether, 4,4'-bis(2,3-epoxypropoxyperfluoroisopropyl)diphenyl ether, 3,4-epoxycyclohexylmethyl-3',4'-epoxycyclohexane carboxylate, 3,4-epoxycyclohexyloxirane, 1,2,5,6-diepoxy-4,7-methanoperhydroindene, 2-(3,4-epoxycyclohexyl)-3',4'-epoxy-1,3-dioxane-5-spirocyclohexane, 1,2-ethylenedioxy-bis(3,4-epoxycyclohexylmethane), 4',5'-epoxy-2'-methylcyclohexylmethyl-4,5-epoxy-2-methylcyclohexane carboxylate, ethylene glycol-bis(3,4-epoxycyclohexane carboxylate), bis-(3,4-epoxycyclohexylmethyl)adipate, di-2,3 -epoxycyclopentyl ether, vinyl-2-chloroethyl ether, vinyl-n-butyl ether, triethylene glycol divinyl ether, 1,4-cyclohexanedimethanol divinyl ether, trimethylolethane trivinyl ether, vinyl glycidyl ether and compounds represented by the formula:

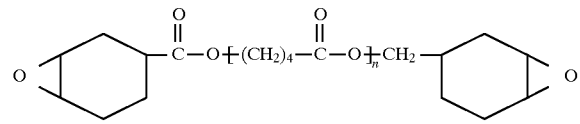

Wherein n is an integer of 1 to 5, and the formula:

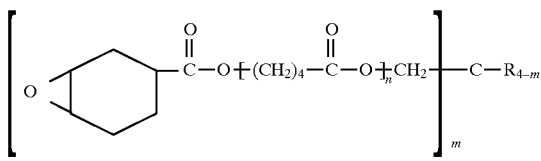

wherein m is 3 or 4, R is an ethyl group or a hydroxymethyl group and n is as defined above. One or more sorts of them may be used.

Further, as the component (b), a radical polymerizable compound having no 9,9-diarylfluorene skeleton can be used. Examples of the radical polymerizable compound having no 9,9-diarylfluorene skeleton include isoamyl acrylate, butoxyethyl acrylate, ethoxydiethylene glycol acrylate, methoxytriethylene glycol acrylate, methoxydipropylene glycol acrylate, tetrahydrofurfuryl acrylate, 2-hydroxyethyl acrylate, 2-hydroxypropyl acrylate, 2-acryloxyethyl-2-hydroxyethylphthalic acid, methyl methacrylate, ethyl methacrylate, n-butyl methacrylate, isobutyl methacrylate, 2-ethylhexyl methacrylate, triethylene glycol diacrylate, neopentyl glycol diacrylate, 1,6-hexanediol diacrylate, trimethylolpropane triacrylate, pentaerythritol triacrylate, pentaerythritol tetracrylate, dipentaerythritol hexaacrylate, 3-acryloxy glycerin monometacrylate, 2-hydroxybutyl acrylate, bis(4-acryloxydiethoxyphenyl)methane, 2,2-bis(4-acryloxyethoxyphenyl)propane, ethyl methacrylate, n-butyl methacrylate, isobutyl methacrylate, 2-ethylhexyl methacrylate, isodecyl methacrylate, cyclohexyl methacrylate, tetrahydrofurfuryl methacrylate, 2-hydroxyethyl methacrylate, 2-hydroxypropyl methacrylate, 2-hydroxybutyl methacrylate, dimethylaminoethyl methacrylate, diethylaminoethyl methacrylate, methacrylic acid, glycidyl methacrylate, ethylene glycol dimethacrylate, diethylene glycol dimethacrylate, 1,4-butanediol dimethacrylate, 1,6-hexanediol dimethacrylate, trimethylolpropane trimethacrylate, glycerin dimethacrylate, t-butyl methacrylate, methoxydiethylene glycol methacrylate, methoxytriethylene glycol methacrylate, n-butoxyethyl methacrylate, 1,3-butanediol dimethacrylate, neopentyl glycol dimethacrylate, bis(4-methacryloxydiethoxyphenyl)methane, 2,2-bis(4-methacryloxyethoxyphenyl)propane, allyl diglycol carbonate and the like. When the radical polymerizable compound having no 9,9-diarylfluorene skeleton is used as the component (b), it is preferred to use the other component (b) or a polymer binder described hereinafter in combination.

As the component (b) other than those described above, for example, there is a plasticizer which is compatible with the component (a). Examples of the plasticizer include phosphate esters such as tributyl phosphate, tri-2-ethylhexyl phosphate, triphenyl phosphate and tricresyl phosphate; phthalate esters such as dimethyl phthalate, diethyl phthalate, dibutyl phthalate, diheptyl phthalate, di-n-octyl phthalate, di-2-ethylhexyl phthalate, diisonony phthalate, octyldodecyl phthalate, diisodecyl phthalate and butylbenzyl phthalate; aliphatic monobasic acid esters such as butyl oleate and glycerin monooleate; aliphatic dibasic acid esters such as diethyl adipate, dibutyl adipate, di-n-hexyl adipate, di-2-ethylhexyl adipate, di-2-ethylhexyl azelate, dibutyl sebacate and di-2-ethylhexyl sebacate; dihydric alcohol esters such as diethylene glycol dibenzoate and triethylene glycol di-2-ethylbutylate; oxy-acid esters such as methyl acetylricinoleate, butyl acetylricinoleate, butylphthalylbutyl glycolate and tributyl acetylacetate; paraffin chloride; chlorinated biphenyl; 2-nitrobiphenyl; dinonylnaphthalene; o-toluenesulfonethylamide; p-toluenesulfonethylamide; camphor; methyl abietate and the like.

The radical photopolymerization initiator (c) used in the present invention may be the initiator which generates an active radical by the first exposure for the production of the hologram, said active radical polymerizing the above radical polymerizable compound (a) which is one of the constituent component of the present invention. As the radical photopolymerization initiator (c), for example, there can be used known initiators disclosed in U.S. Pat. Nos. 4,766,055, 4,868,092 and 4,965,171, Japanese Laid-Open Publication Nos. 54-151024, 58-15503, 58-298037 59-189340, 60-76735 and 1-28715, Japanese Patent Application No. 3-5589, "PROCEEDINGS OF CONFERENCE ON RADIATION CURING ASIA", page 461–477 (1988) and the like, but it is not limited to a specific one.

The term "initiator" used in this specification means that a sensitizer which is normally the component absorbing light can be used in combination with an active radical generating compound or an acid generating compound. As the sensitizer in the radical photopolymerization initiator, a colored compound such as a dye is used popularly so as to absorb visible laser beam, however, when transparency is required for the final hologram (e.g. the use for head up display of automobile, etc.), cyanine dyes disclosed in Japanese Laid-Open Patent Publication Nos. 58-29803 and 1-287105 and Japanese Patent Application No. 3-5569 are used, preferably. The cyanine dye is normally liable to be decomposed by light and, therefore, the dye in the hologram is decomposed by the post exposure or by allowing to stand under room light or sunlight for several hours to several days, which results in no absorption at a visible light range. Thus, a transparent hologram can be obtained. Examples of the cyanine dye include anhydro-3,3'-dicarboxymethyl-9-ethyl-2,2'-thiacarbocyanine betaine, anhydro-3-carboxymethyl-3', 9'-diethyl-2,2'-thiacarbocyanine betaine, 3,3',9-triethyl-2,2'-thiacarbocyanine iodine salt, 3,9-diethyl-3'-carboxymethyl-2,2'-thiacarbocyanine iodine salt, 3,3',9-triethyl-2,2'-(4,5,4', 5'-dibenzo)thiacarbocyanine iodine salt, 2-[3-(3-ethyl-2-benzothiazolidene)-1-propenyl]-6-[2-(3-ethyl-2-benzothiazolidene)ethylideneimino]-3-ethyl-1, 3,5-thiadiazolium iodine salt, 2-[[3-allyl-4-oxo-5-(3-n-propyl-5, 6-dimethyl-2-benzothiazolidene)-ethylidene-2-thiazolinylidene]methyl]3-ethyl-4,5-diphenylthiazolinium iodine salt, 1,1',3,3,3',3'-hexamethyl-2,2'-indotricarbocyanine iodine salt, 3,3'-diethyl-2,2'-thiatricarbocyanine perchlorate, anhydro-1-ethyl-4-methoxy-3'-carboxymethyl-5'-chloro-2,2'-quinothiacyanine betaine, anhydro-5,5'-diphenyl-9-ethyl-3,3'-disulfopropyloxacarbocyanine hydroxide triethylamine salt and the like. One or more of these dyes may be used.

As the active radical-generating compound which may be used in combination with the cyanine dye, for example, there are diaryl iodonium salts disclosed in the above-described Japanese Laid-Open Patent Publication Nos. 58-29803 and 1-287105 and Japanese Patent Application No. 3-5569, or 2,4,6-substituted-1,3,5-triazines. When high photosensitivity is required, it is particularly preferred to use diaryl iodonium salts, preferably. Examples of diaryl iodonium salts include chloride, bromide, tetrafluoroborate, hexafluorophosphate, hexafluoroaresenate, hexafluoroantimonate, trifluoromethanesulfonate and 9,10-dimethoxyanthracene-2-sulfonate of diphenyl iodonium, 4,4'-dichlorodiphenyl iodonium, 4,4'-dimethoxydipehyl iodonium, 4,4'-ditertiary butyldiphenyl iodonium, 3,3'-dinitrodiphenyl iodonium and the like. Further, examples of 2,4,6-substituted-1,3,5-triazines include 2-methyl-4,6-bis (trichloromethyl)-1,3,5-triazine, 2,4,6-tris(trichloromethyl)-1,3,5-triazine, 2-phenyl-4,6-bis(trichloromethyl)-1,3,5-triazine, 2,4-bis(trichloromethyl)-6-(p-methoxyphenylvinyl)-1,3,5-triazine, 2-(4'-methoxy-1'-naphthyl)-4,6-bis(trichloromethyl)-1,3,5-triazine and the like.

The cationic photopolymerization initiator (d) used in the present invention may be those having low photosensitivity to the first exposure, which are subjected to the post exposure due to the irradiation of light having a wavelength different from that of the first exposure to produce Brönsted acid or Lewis acid which can polymerize the above cationic polymerizable compound (b). In the present invention, it is preferred that the cationic polymerizable compound which is liquid at an ambient normal temperature is present without being reacted almost while the radical polymerizable compound is polymerized by irradiating laser beam or light having excellent coherence. Therefore, large refractive index modulation can be obtained in comparison with a conventional technique. Accordingly, those which do not polymerize the cationic polymerizable compound during the first exposure are particularly preferred as the cationic photopolymerization initiator. As the cationic photopolymerization initiator (d), for example, there are those disclosed in "UV CURING: SCIENCE AND TECHNOLOGY", PP 23–76, edited by S. PETER PAPPAS; A TECHNOLOGY MARKETING PUBLICATION; and "Comments Inorg. Chem.", B. KLINGERT, M. RIEDIKER and A. ROLOFF, Vol. 7, No. 3, PP 109–138 (1988). One or more sorts of them may be used.

As the particularly preferred cationic photopolymerization initiator (d) used in the present invention, for example, there are diaryl iodonium salts, triaryl sulfonium salts, iron arene complexes and the like.

Examples of the preferred diaryl iodonium salts as the cationic photopolymerization initiator (d) include tetrafluoroborate, hexafluorophosphate, hexafluoroarsenate, hexafluoroantimonate, trifluoromethanesulfonate and 9,10-dimethoxyanthracenesulfonate of idoniums described as to the above radical photopolymerization initiator (c). Examples of the preferred triarylsulfonium salts include tetrafluoroborate, hexafluorophosphate, hexafluoroarsenate, hexafluoroantimonate, trifluoromethanesulfonate and 9,10-dimethoxyanthracene-2-sulfonate of sulfoniums such as triphenylsulfonium, 4-tertiary butyltriphenylsulfonium, tris (4-methylphenyl)sulfonium, tris(4-methoxyphenyl) sulfonium, 4-thiophenyltriphenylsulfonium and the like.

The photopolymerization initiator (d) having "low photosensitivity" to laser beam or light having excellent coherence in this specification means those in which a maximum DSC value obtained by conducting a thermal analysis at the following conditions, which is attributed to the photopolymerization initiated by the cationic photopolymerization initiator (d), is not more than 500 $\mu$W per 1 mg of the following sample to be measured (including 0 $\mu$W).

Measuring equipment: A differential calorimeter DSC220 and an light source equipment UV-1 are used in a thermal analysis system SSC5200H manufactured by Seiko Denshi Kogyo Co.

Sample to be measured: It is prepared by dissolving the objective cationic photopolymerization initiator (d) in a cationic polymerizable compound UVR-6110 manufactured by Union Carbide Co. in an amount of 3 wt % based on the weight of the compound (After dissolving it by adding an organic solvent, the organic solvent may be evaporated).

Irradiation light: Light of which wavelength is adjusted to the same level as that of laser beam or light having excellent coherence using an interference filter (half-width: about 10 nm) is irradiated at an irradiation dose of 200 mJ/cm$^2$.

The photosensitive composition of the present invention may be used in combination with polymer binders, thermal polymerization inhibitors, silane coupling agents, colorants and the like, if necessary. The polymer binder is used for improving film-forming property of the composition and uniformity of the film thickness before the formation of the hologram, and for holding the interference fringe formed by the radical polymerization stable until the post exposure. The polymer binder may be those which have good compatibility with the cationic polymerizable compound and a radical polymerizable compound. Examples thereof include chlorinated polyethylene, polymethyl methacrylate, copolymer of methyl methacrylate with the other alkyl (meth) acrylate, copolymer of vinyl chloride with acrylonitrile, polyvinyl acetate, polyvinyl alcohol, polyvinyl formal, polyvinyl butyral, polyvinyl pyrrolidone, ethyl cellulose, acetyl cellulose and the like. The polymer binder may have a reactive group such as a cationic polymerizable group at a side or main chain thereof.

In the photosensitive composition of the present invention, an amount of the component (a) is preferably 5 to 80 wt % by weight (particularly 30 to 60 wt % by weight), an amount of the component (b) is preferably 10 to 80 wt % by weight (particularly 30 to 60 wt % by weight), an amount of the radical photopolymerization initiator (c) is preferably 0.3 to 8 wt % by weight (particularly 1 to 5 wt % by weight) and an amount of the cationic photopolymerization initiator (d) is preferably 0.3 to 8 wt % (particularly 1 to 5 wt % by weight), based on the total weight of the composition.

The photosensitive composition of the present invention may be prepared by a conventional method. For example, it can be prepared by formulating the above constituent components (a) to (d) in the absence or presence of solvents (e.g. ketone solvents such as methyl ethyl ketone, acetone, cyclohexanone, etc.; ester solvents such as ethyl acetate, butyl acetate, ethylene glycol diacetate, etc.; aromatic solvents such as toluene, xylene, etc.; cellosolve solvents such as methyl cellosolve, ethyl cellosolve, butyl cellosolve, etc.; alcohol solvents such as methanol, ethanol, propanol, etc.; ether solvents such as tetrahydrofuran, dioxane, etc.; halogen solvents such as dichloromethane, dichloroethane, chloroform, etc.), followed by mixing in a dark place using a high-sped stirrer.

In the production of the hologram of the present invention, a recording layer 2 can be formed by applying the above photosensitive composition on a transparent substrate 1 (see FIGS. 1 and 2) such as glass plate, polyethylene terephthalate film, polyethylene film, acrylic plate, etc. according to a normal method, followed by drying if needed. A coating weight is selected appropriately, for example, the dry coating weight may be 1 to 50 g/m$^2$. Normally, a protective layer 3 such as polyethylene terephthalate film, polyethylene film, polypropylene film, etc. is provided additionally on the recording layer 2. According to the other method for preparing a three-layer composite of which intermediate layer is a recording layer made of the composition of the present invention, a recording layer 2 is firstly formed between two polyethylene terephthalate films, one of which is subjected to a treatment which enables easy peeling, and then one of films is peeled off upon use to laminate the peeled surface of a recording layer 2 on a suitable substrate. Further, the composition of the present invention can also be injected between two glass plates.

In the recording layer 2 thus prepared, an interference fringe is recorded in the interior thereof by polymerizing the above radical polymerizable compound (a) using a normal holography exposure equipment according to laser beam or light having excellent coherence 4 (wavelength: 300 to 1200 nm). In the case of the composition of the present invention, diffraction light due to the recorded interference fringe can be obtained to afford a hologram at this stage. However, a film strength of the hologram is small in this state. Therefore, in order to polymerize a part of the unreacted radical polymerizable compound, radical polymerizable compound formulated as the component (b) and cationic polymerizable compound, the hologram is exposed to light from a light source such as Xenon lamp, mercury vapor lamp, metal halide lamp and the like (post exposure) to obtain a hologram of the present invention. In the case of polymerizing the radical polymerizable compound, it is necessary to use those which emit light having a wavelength, to which the radical photopolymerization initiator (c) is sensitized, as the light source. In the case of polymerizing the cationic polymerizable compound formulated as the component (b), it is necessary to use those which emit light having a wavelength, to which the radical photopolymerization initiator (d) is sensitized. By treating the recording layer with heat or infrared light before the post exposure, diffraction efficiency, peak wavelength of diffraction light, band width and the like can be changed.

For example, the above volume hologram can be used for lens, diffraction grating, interference filter, head-up display device, normal three-dimensional display, connector for optical fiber, optical polariscope for facsimile, memory material for ID card, constructional window glass, advertising medium and the like.

With the photosensitive composition for volume hologram recording of the present invention, a volume hologram having excellent diffraction efficiency, wavelength selectivity, refractive index modulation and transparency can be produced easily.

EXAMPLES

The following Examples and Comparative Examples further illustrate the present invention in detail but are not to be construed to limit the scope thereof.

By using the photosensitive composition shown in the Examples and Comparative Examples described hereinafter, a test plate was prepared by the following method. Then, the resulting plate was exposed to light to obtain a hologram, and physical properties of the hologram were evaluated by the following method.

Preparation of the Test Plate

A predetermined amount of a radical photopolymerization initiator (c) and a cationic photopolymerization initiator (d) were dissolved or dispersed in a solvent of dichloroethane (1.5 g) and methyl ethyl ketone (1.5 g). To the resulting mixture, a radical polymerizable compound (a), component (b), and a polymer binder were added, followed by stirring and further filtration to obtain a photosensitive solution. The photosensitive solution was applied on a glass plate of 16 cm×16 cm in size using an applicator, followed by drying at 60° C. for 5 minutes. A polyethylene film of 80 µm in thickness (Lupic LI, manufactured by Tonen Kagaku Co.) was laminated thereon using a roller for laminating and the resulting plate was cut into pieces of 3–4 by 3–4 centimeters square to give a test plate.

Exposure

Figure 2:
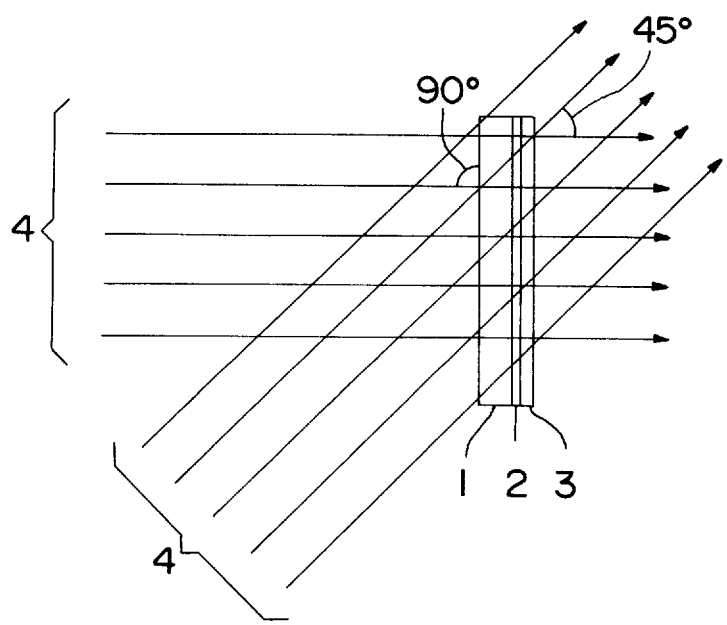
FIG. 2 is a schematic diagram illustrating a recording method of a transmission type hologram in the first exposure.

It was conducted using light (514.5 nm) from an argon ion laser except for a partial case of a first exposure. A schematic diagram illustrating a recording method of a reflection type hologram is shown in FIG. 1, and a schematic diagram illustrating a recording method of a transmission type hologram is shown in FIG. 2. A light intensity of one light flux on the surface of the test plate was 1.0 mW/cm$^2$ and an exposure time was 30 seconds except for a partial case.

After the completion of the first exposure, a post exposure was conducted by irradiating light of a high pressure mercury vapor lamp (laboratory ultraviolet light irradiation equipment FL-1001-2, manufactured by Nihon Storage Battery Co., Ltd.) from the back of the polyethylene film for one minute.

Evaluation

Diffraction efficiency of the reflection type hologram was determined by measuring a reflectance of the hologram using a spectrophotometer UV-2100 manufactured by Shimazu Seisakusho Corp. with an attachment integrating sphere reflector ISR-260. Diffraction efficiency of the transmission type hologram was determined by measuring a transmittance of the hologram, using the above spectrophotometer. Further, a film thickness of the part of measurement for diffraction efficiency was measured using a film thickness measuring device Betascope 850 manufactured by Fischer Co. A refractive index modulation (half value of change in refractive index of interference fringe) was determined by calculating from diffraction efficiency and the film thickness thus obtained. The calculation formula disclosed in "Coupled Wave Theory for Thick Hologram Gratings", H. Kogelnik, Bell Syst. Tech. J., Vol. 48, PP 2909–2947 (1969) was used. The value of refractive index modulation does not depend on the film thickness, and refractive index modulation capability can be compared by the value.

The following photosensitive composition of the Examples and Comparative Examples was prepared, and a hologram was prepared by the above method. The hologram was evaluated according to the same manner as that described above.

Examples 1 to 3

In these Examples, a reflection type hologram was prepared using BPFL-A or BPFL-B as the radical polymerizable compound (a) having a 9,9-diarylfluorene skeleton, which is liquid at a normal temperature, and various cationic polymerizable compounds (b). As the radical photopolymerization initiator (c), a combination of DYE-1 with diphenyl iodonium trifluoromethanesulfonate (DPI.CF$_3$SO$_3$) was used. As the cationic photopolymerization initiator (d), triaryl sulfonium hexafluoroantimonate (TPS.SbF$_6$) was used. The first exposure was conducted at 514.5 nm for 30 seconds in all Examples.

The amount of each component and the evaluation results of the hologram are shown in Table 1 below. In all Examples, a practical transparent reflection type hologram was obtained.

Comparative Examples 1 to 3

These are Comparative Examples against Examples 1 to 3, wherein no reflection type hologram is obtained or a reflection type hologram having insufficient performance is obtained when the radical polymerizable compound BPFL-A having a 9,9-diarylfluorene skeleton, which is liquid at a normal temperature, and the cationic polymerizable compound (b) are not used in proper combination.

The amount of each component and the evaluation results of the hologram are shown in Table 2 below.

Comparative Examples 4 to 8

These are Comparative Examples against Examples 1 to 3, wherein no reflection type hologram is obtained or a reflection type hologram having insufficient performance is obtained when the radical polymerizable compound having no 9,9-diarylfluorene skeleton or the radical polymerizable compound having a 9,9-diarylfluorene skeleton, which is solid at a normal temperature, is used.

The amount of each component and the evaluation results of the hologram are shown in Table 3 below.

TABLE 1

| Example No. | Composition of photosensitive composition (mg) | | | | | | Solvent used for dissolution/dispersion (mg) | Evaluation results of reflection type hologram | | | | |
|---|---|---|---|---|---|---|---|---|---|---|---|---|
| | Radical polymerizable compound (a) | Cationic polymerizable compound (b) | DYE-1 | DPI. $CF_3SO_3$ | TPS. $SbF_6$ | Polymer binder | | Film thickness ($\mu$m) | Peak wavelength of diffraction light (nm) | Diffraction efficiency (%) | Refractive index modulation | Pencil hardness |
| 1 | BPFL-A, 900 | CAT-1, 900 | 5 | 60 | 80 | P-1, 500 | DCE 1500 MEK 1500 | 20.0 | 504 | 73 | 0.0088 | 2H |
| 2 | BPFL-A, 900 | CAT-2, 900 | 5 | 60 | 80 | P-1, 500 | DCE 1500 MEK 1500 | 16.6 | 505 | 83 | 0.0128 | H |
| 3 | BPFL-B, 900 | CAT-1, 900 | 5 | 60 | 80 | P-1, 500 | DCE 1500 MEK 1500 | 17.8 | 508 | 82 | 0.0117 | H |

TABLE 2

| Comparative Example No. | Composition of photosensitive composition (mg) | | | | | | Solvent used for dissolution/dispersion (mg) | Evaluation results of reflection type hologram | | | |
|---|---|---|---|---|---|---|---|---|---|---|---|
| | BPFL-A | Cationic polymerizable compound (b) | DYE-1 | DPI. $CF_3SO_3$ | TPS. $SbF_6$ | Polymer binder | | Film thickness ($\mu$m) | Peak wavelength of diffraction light (nm) | Diffraction efficiency (%) | Refractive index modulation |
| 1 | — | CAT-1, 900 | 5 | 60 | 80 | P-1, 500 | DCE 1500 MEK 1500 | 16.8 | — | 0 | 0 |
| 2 | 900 | — | 5 | 60 | 80 | P-1, 500 | DCE 1500 MEK 1500 | 17.4 | 504 | ~2 | 0 |
| 3 | 900 | CAT-3, 900 | 5 | 60 | 80 | P-1, 500 | DCE 1500 MEK 1500 | 17.9 | 504 | ~1 | ~0 |

TABLE 3

| Comparative Example No. | Composition of photosensitive composition (mg) | | | | | | Solvent used for dissolution/dispersion (mg) | Evaluation results of reflection type hologram | | | | |
|---|---|---|---|---|---|---|---|---|---|---|---|---|
| | Radical polymerizable compound (a) | Cationic polymerizable compound (b) | DYE-1 | DPI. $CF_3SO_3$ | TPS. $SbF_6$ | Polymer binder | | Film thickness ($\mu$m) | Peak wavelength of diffraction light (nm) | Diffraction efficiency (%) | Refractive index modulation | Remarks |
| 4 | AEPH, 900 | CAT-1, 900 | 5 | 60 | 80 | P-1, 500 | DCE 1500 MEK 1500 | 15.5 | 520 | 20 | 0.0043 | |
| 5 | AEPM, 900 | CAT-2, 900 | 5 | 60 | 80 | P-1, 500 | DCE 1500 MEK 1500 | 15.8 | 521 | 17 | 0.0039 | |
| 6 | AEPM, 450 BAPP, 450 | CAT-1, 900 | 5 | 60 | 80 | P-1, 500 | DCE 1500 MEK 1500 | 13.4 | 519 | 14 | 0.0041 | |
| 7 | AEPM, 450 BAPS, 450 | CAT-1, 900 | 5 | 60 | 80 | P-1, 500 | DCE 1500 MEK 1500 | 14.6 | 510 | 12 | 0.0035 | hazy |
| 8 | BPFL-C, 900 | CAT-1, 900 | 5 | 60 | 80 | P-1, 500 | DCE 1500 MEK 1500 | 15.1 | — | — | — | No recording because of haze of photosensitive material |

Examples 4 to 5

In these Examples, a reflection type hologram was prepared using BPFL-A as the radical polymerizable compound (a) and a plasticizer as the component (b). As the radical photopolymerization initiator (c), a combination of DYE-1 with diphenyl iodonium trifluoromethanesulfonate (DPI.CF$_3$SO$_3$) was used. The first exposure was conducted at 514.5 nm for 30 seconds in all Examples.

The amount of each component and the evaluation results of the hologram are shown in Table 4 below. In all Examples, a practical transparent reflection type hologram was obtained.

The resulting holograms of Examples 4 and 5 are considerably inferior in the film strength in comparison with Examples 1 and 2, because no cationic polymerizable compound is used.

Example 10

In this Example, a reflection type hologram diffracting blue light was prepared according to the same condition as that described in Example 1 except that DYE-2 was used in place of DYE-1 and the first exposure was conducted by exposing to light (488.0 nm) from an argon ion laser (light intensity of one light flux: 1.00 mW/cm$^2$) for 30 seconds.

The evaluation results of the hologram are shown in Table 6 below. A practical transparent reflection type hologram was obtained.

TABLE 4

| Example No. | Composition of photosensitive composition (mg) | | | | | Solvent used for dissolution/ dispersion (mg) | Evaluation results of reflection type hologram | | | | |
|---|---|---|---|---|---|---|---|---|---|---|---|
| | BPFL-A | Component (b) | DYE-1 | DPI. CF$_3$SO$_3$ | Polymer binder | | Film thickness ($\mu$m) | Peak wavelength of diffraction light (nm) | Diffraction efficiency (%) | Refractive index modulation | Pencil hardness |
| 4 | 900 | PLA-1, 900 | 5 | 60 | P-1, 500 | DCE 1500 MEK 1500 | 16.8 | 502 | 54 | 0.0077 | 68 or less |
| 5 | 900 | PLA-2, 900 | 5 | 60 | P-1, 500 | DCE 1500 MEK 1500 | 17.8 | 500 | 75 | 0.0102 | 48 |

Examples 6 and 7

In these Examples, a reflection type hologram was prepared according to the same condition as that described in Examples 1 and 2 except for using no polymer binder P-1.

The amount of each component and the evaluation results of the hologram are shown in Table 5 below. In all Examples, a practical transparent reflection type hologram was obtained.

Examples 8 and 9

In these Examples, a transmission type hologram was prepared. The same test plate as that of Examples 2 and 4 was used.

The evaluation results of the hologram are shown in Table 5 below. In all Examples, a practical transparent transmission type hologram was obtained.

Example 11

In this Example, a reflection type hologram diffracting red light was prepared according to the same condition as that described in Example 1 except that DYE-3 was used in place of DYE-1 and the first exposure was conducted by exposing light (632.8 nm) from a helium-neon laser (light intensity of one light flux: 0.15 mW/cm$^2$) for 60 seconds.

The evaluation results of the hologram are shown in Table 6 below. A practical transparent reflection type hologram was obtained.

TABLE 5

| Example No. | Composition of photosensitive composition | Type of hologram | Film thickness ($\mu$m) | Peak wavelength of diffraction light (nm) | Diffraction efficiency (%) | Refractive index modulation |
|---|---|---|---|---|---|---|
| 6 | Formulation wherein P-1 is eliminated from Example 1 | Reflection | 15.2 | 507 | 47 | 0.0076 |
| 7 | Formulation wherein P-1 is eliminated from Example 2 | Reflection | 16.7 | 509 | 58 | 0.0083 |
| 8 | the same as Example 2 | Transmission | 17.4 | 505 | 70 | 0.0078 |
| 9 | the same as Example 4 | Transmission | 16.5 | 516 | 78 | 0.0090 |

TABLE 6

| Example No. | Composition of photosensitive composition (mg) | | | | | Solvent used for dissolution/ dispersion (mg) | Evaluation results of reflection type hologram | | | |
|---|---|---|---|---|---|---|---|---|---|---|
| | BPFL-A | Cationic polymerizable compound (b) | Radical photopolymerization initiating material (c) | TPS. SbF$_6$ | Polymer binder | | Film thickness (μm) | Peak wavelength of diffraction light (nm) | Diffraction efficiency (%) | Refractive index modulation |
| 10 | 900 | CAT-1, 900 | DYE-2, 5 DPI.CF$_3$SO$_3$, 60 | 80 | P-1, 500 | DCE 1500 MEK 1500 | 18.4 | 481 | 63 | 0.0071 |
| 11 | 900 | CAT-1, 900 | DYE-3, 8 DPI.CF$_3$SO$_3$, 60 | 80 | P-1, 500 | DCE 1500 MEK 1500 | 17.1 | 622 | 12 | 0.0126 |

Abbreviations for compounds shown in the above Examples 1 to 11, Comparative Examples 1 to 8 and Tables 1 to 6 are as follows. The refractive index given in parentheses was measured using Abbe's refractometer.

| Radical polymerizable compound (a) | |
|---|---|
| BPFL-A (1.594) | 9,9-Bis(4-acryloxydiethoxyphenyl)fluorene |
| BPFL-B (1.587) | 9,9-Bis(3-ethyl-4-acryloxydiethoxyphenyl)fluorene |
| BPFL-C (1.612) | 9,9-Bis(4-acryloxyphenyl)fluorene |
| AEPM (1.539) | Bis(4-acryloxydiethoxyphenyl)methane |
| BAPP (1.590) | 2,2-Bis(3,5-dibromo-4-acryloxyethoxyphenyl)propane |
| BAPS (1.632) | 4,4'-Bis(acryloxyethoxyethylthio)phenyl sulfide |
| Component (b) | |
| CAT-1 (1.498) | 3,4-Epoxycyclohexylmethyl-3',4'-epoxycyclohexane carboxylate, UVR-6110 manufactured by Union Carbide Co. |
| CAT-2 (1.487) | Pentaerythritol polyglycidyl ether, Denacol Ex-411 manufactured by Nagase Kasei Kogyo Co. |
| CAT-3 (1.601) | Dibromophenyl glycidyl ether, Denacol Ex-147 manufactured by Nagase Kasei Kogyo Co. |
| PLA-1 (1.426) | Diethyl adipate |
| PLA-2 (1.434) | Diethyl sebacate |
| Radical photopolymerization initiator (c) and Cationic photopolymerization initiator (d) | |
| DYE-1 | 3,9-Diethyl-3'-carboxymethyl-2,2'-thiacarbocyanine iodine salt |
| DYE-2 | 3,3'-Carbonylbis(7-diethylaminocumarin) |
| DPI.CF$_3$SO$_3$ | Diphenyl iodonium trifluoromethanesulfonate salt |
| DYE-3 | 2-[3-(3-Ethyl-2-benzothiazolidene)-1-propenyl]-6-[2-(3-ethyl-2-benzothiazolidene)ethylideneimino]-3-ethyl-1,3,5-thiazolium iodine salt |
| TPS.SbF$_6$ | Triarylsulfonium hexafluoroantimonate compound manufactured by Ciba Geugy Co. |
| Others | |
| P-1 | Copolymer of methyl methacrylate/ethyl acrylate/acrylic acid (copolymerization ratio: 45/49/6) |
| DCE | Dichloroethane |
| MEK | Methyl ethyl ketone |

What is claimed is:

1. A photosensitive composition for volume hologram recording used for recording an interference fringe produced by the interference of laser beams or lights having excellent coherence as a fringe with a different refractive index, said composition comprising the components as follows:

(a) a radical polymerizable compound represented by the formula:

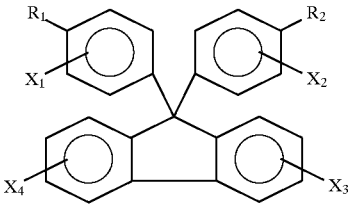

wherein $R_1$ and $R_2$ is a terminal radical polymerizable group bonded to the phenyl ring of the diarylfluorene skeleton through at least one oxyethylene chain, oxypropylene chain, urethane group or amide group, and $X_1$ to $X_4$, respectively, indicate H, ($C_1$–$C_4$) alkyl group, ($C_1$–$C_4$) alkoxy group, amino group, dialkylamino group, hydroxyl group, carboxyl group or halogen atom:

(b) a cationic polymerizable compound having compatibility with component (a);

(c) a radical photopolymerization initiator which is sensitized to a laser beam having a specific wavelength or light having a specific wavelength and excellent coherence to polymerize the component (a);

wherein an average refractive index of the component (a) is larger than that of the component (b); and (d) a cationic photopolymerization initiator having low photosensitivity to light having a specific wavelength, which is sensitive to light having a different wavelength to polymerize the component (b).

2. The composition according to claim 1, wherein a sensitizer contained in the radical photopolymerization initiator (c) is a cyanine dye.

3. The composition according to claim 1, wherein an active radical-generating compound contained in the radical photopolymerization initiator (c) is a diaryl iodonium salt.

4. The composition according to claim 1 which further comprises a polymer binder.

5. The composition according to claim 1, wherein the component (b) is a liquid compound at ambient temperature.

6. The composition according to claim 5, wherein a sensitizer contained in the radical photopolymerization initiator (c) is a cyanine dye.

7. The composition according to claim 5, wherein an active radical-generating compound contained in the radical photopolymerization initiator (c) is a diaryl iodonium salt.

8. The composition according to claim 5, which further comprises a polymer binder.

* * * * *